(12) United States Patent
Lin

(10) Patent No.: US 7,999,589 B2
(45) Date of Patent: Aug. 16, 2011

(54) CIRCUITS AND METHODS FOR CLOCK SIGNAL DUTY-CYCLE CORRECTION

(75) Inventor: Feng Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/553,792

(22) Filed: Sep. 3, 2009

(65) Prior Publication Data

US 2011/0050307 A1  Mar. 3, 2011

(51) Int. Cl.
*H03K 3/017* (2006.01)
(52) U.S. Cl. .................. 327/175; 327/172
(58) Field of Classification Search .............. None
See application file for complete search history.

(56) References Cited

U.S. PATENT DOCUMENTS

| | | | | |
|---|---|---|---|---|
| 5,179,303 A | * | 1/1993 | Searles et al. | 327/277 |
| 6,927,642 B2 | * | 8/2005 | Hsieh | 331/175 |
| 7,078,949 B2 | * | 7/2006 | Kim et al. | 327/158 |
| 7,308,065 B2 | * | 12/2007 | Donnelly et al. | 375/373 |
| 7,701,273 B2 | * | 4/2010 | Choi | 327/158 |
| 7,791,388 B2 | * | 9/2010 | Gomm | 327/175 |
| 2007/0159224 A1 | * | 7/2007 | Dwarka et al. | 327/175 |

* cited by examiner

*Primary Examiner* — Cassandra Cox
(74) *Attorney, Agent, or Firm* — Dorsey & Whitney LLP

(57) ABSTRACT

Duty-cycle correction circuits, clock distribution networks, and methods for correcting duty-cycle distortion are disclosed, including methods and apparatus for correcting duty-cycle distortion of differential output clock signals provided from a clock distribution network. In one such method, a single-ended clock signal is generated from differential input clock signals for distribution over a clock distribution network and from which the differential output clock signals are generated. A delay of a model delay path is matched to a propagation delay of the clock distribution network, and the single ended clock signal is adjusted to compensate for duty-cycle distortion.

28 Claims, 6 Drawing Sheets

CIRCUITS AND METHODS FOR CLOCK SIGNAL DUTY-CYCLE CORRECTION

TECHNICAL FIELD

Embodiments of the invention relate generally to clock signal generators, and more particularly, clock signal generators providing duty-cycle corrected clock signals over a clock distribution network.

BACKGROUND OF THE INVENTION

Clock signals are often used in electronic circuits for timing internal operation of various circuits necessary to execute an operation. For example, in synchronous memories, external clock signals are provided to the memory and internally distributed to different circuits of the circuit to carry out memory operations. Typically, a clock distribution network is used to route internal clock signals generated from the external clock signal to the different circuits. In this manner, operation of the integrated circuit can be coordinated with the external clock signals.

When generating and routing the internal clock signals, however, maintaining the quality of the clock signals while being distributed to the various circuits can present challenges. An example of a challenge to maintaining the quality of the clock signals is generating internal clock signals while maintaining the duty-cycle of the external clock signals. The duty-cycle of a clock signal becomes distorted when the ratio of the high and low portions of a generated clock signal is different than that of the clock signal from which it is generated. Duty-cycle distortion may be process-induced, that is, the device characteristics of the clock generation circuits and clock distribution circuits can shift due to variation in the manufacturing process for the integrated circuit causing the resulting internal clock signal to be distorted. As a result of the duty-cycle distortion, when generating and distributing the internal clock signal, the various circuits receive a distorted version of the external clock signal. Due to the duty-cycle distortion, performance of the integrated circuit may be reduced, and in extreme cases, may cause the integrated circuit to function incorrectly.

Various approaches have been used to manage duty-cycle distortion in generating and distributing internal clock signals. For example, where external differential clock signals (i.e., both a clock signal and its complement) are used, the clock distribution network includes differential clock paths having separate clock paths for each of the differential clock signals. As known, using differential clock paths may reduce duty-cycle distortion in distributing internal differential clock signals to various circuits. This approach, however, consumes significant power to drive the circuitry of the differential clock path and requires considerable space to accommodate the parallel clock paths of the differential clock path.

Another example approach is to generate two internal single-ended clock signals (sometimes referenced as "pseudo-differential") from an external differential clock signal and distribute the single-ended clock signals to be used to generate an internal differential clock signal for the various circuits. This approach also requires two separate clock paths to distribute the single-ended clock signals and suffers from the same issues as using a differential clock path, that is, significant power consumption and space for the two clock paths. Another example approach is to convert an external differential clock signal into a single-ended clock signal for distribution to the circuits. Although this approach has the benefits of using less power and requiring less space for the clock path in comparison to the previously discussed approaches, as known, distributing a single-ended clock signal and generating an internal differential clock signal from the single-ended clock signal is more susceptible to introducing duty-cycle distortion, such as that related to process-induced distortion.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
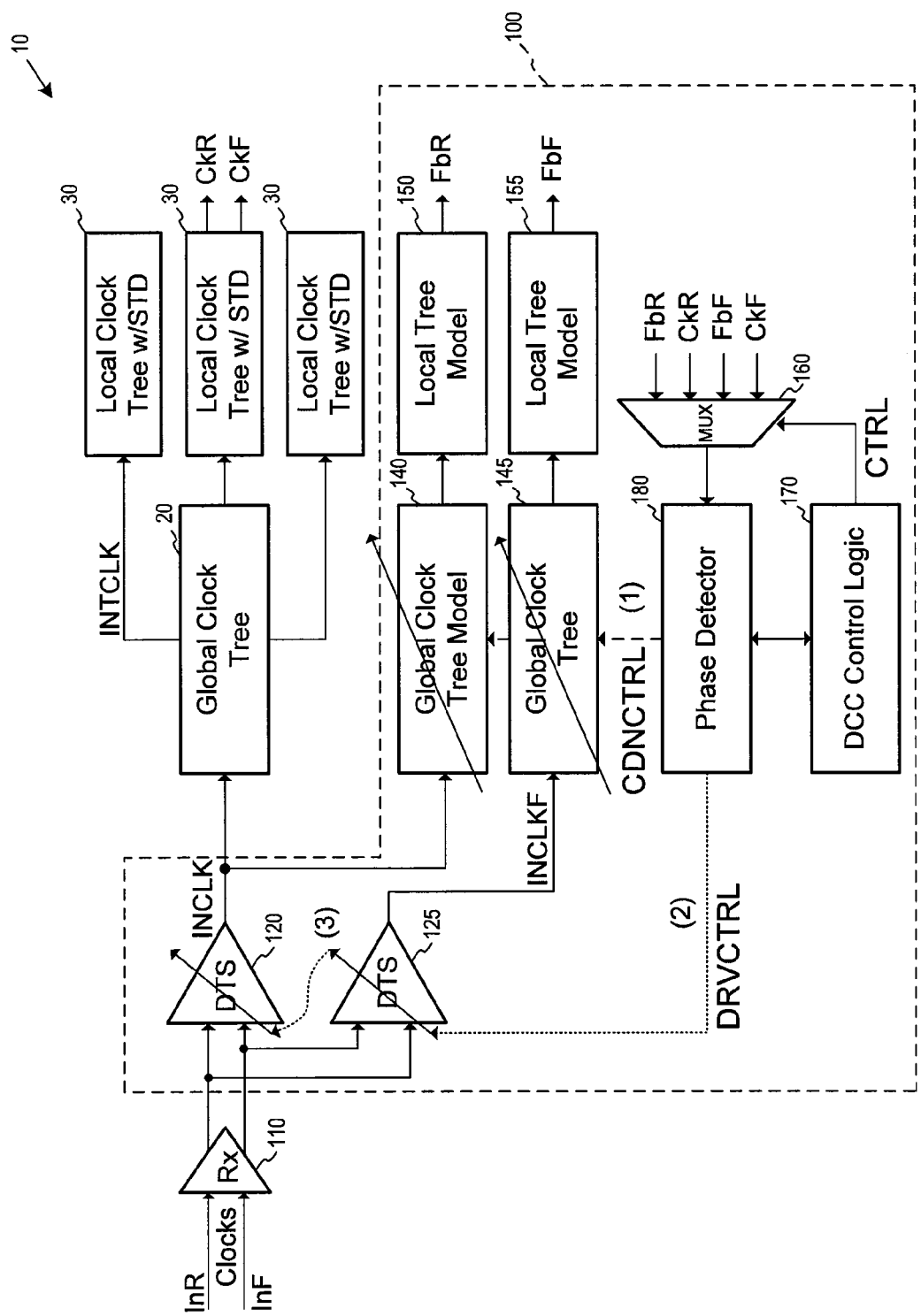
FIG. 1 is a block diagram of an example duty-cycle correction circuit.

FIG. 1 illustrates a duty-cycle correction (DCC) circuit 100 according to an embodiment of the invention and a portion of clock signal distribution network (CDN) 10. The CDN 10 includes a global clock tree circuit 20 that receives an input clock signal INCLK and distributes the INCLK signal throughout the circuit. In the embodiment of FIG. 1, the INCLK signal received by the global clock tree circuit 20 is a "single-ended" clock signal, that is, the global clock tree circuit 20 receives a clock signal but not its complementary clock signal. In contrast, both a clock signal and its complement are provided when "differential" clock signals are used. The global clock tree circuit 20 distributes the INCLK signal to local clock tree circuits and single-ended-to-differential (STD) clock driver 30 as an internal clock signal INTCLK. The local clock tree circuits and STD clock driver 30 generates differential clock signals CkR, CkF responsive to the distributed INTCLK signal. The CkR, CkF signals are typically provided to clocked circuitry, for example, clocked output data circuits, clocked input data circuits, and the like. A multi-level clock tree distribution network, as shown in FIG. 1, is used to efficiently provide the INCLK signal to various circuits located at different locations over a semiconductor die on which the integrated circuit is formed. Although two-levels of clock trees are shown in FIG. 1, other embodiments of the invention have greater or fewer levels of clock trees.

The DCC circuit 100 is coupled to the CDN 10 to provide the INCLK signal to the global clock tree circuit 20. The INCLK signal is generated by a differential-to-single-ended (DTS) clock driver 120 responsive to receiving differential input clock signal InR, InF from a differential clock receiver 110. As previously discussed, the differential clock signals, such as the InR, InF signals are complementary clock signals. The differential clock receiver 110 buffers the InR, InF signals before being provided to the DTS clock driver 120. The InR, InF, signals are further provided to a DTS clock driver 125 which generates an INCLKF signal responsive to the InR, InF signals. The INCLKF signal is complementary to the INCLK signal. In some embodiments, the DTS clock driver 120, 125 are the same in design and operation, and the INCLK and INCLKF signals are generated by reversing the InR, InF signals to the inputs of the respective DTS clock driver 120, 125. The DTS clock drivers 120, 125 have adjustable electrical characteristics that can be used to alter the INCLK, INCLKF signals. For example, in one embodiment, the DTS clock drivers 120, 125 have adjustable output drive strength controlled by a control signal DRVCTRL. The adjustable output drive strength adjusts the transition rates of clock edges of the output clock signal, for example, the transition rate of the rising edges of the output clock signal. The drive strength of the DTS clock drivers can be increased (i.e., faster slew rate, shorter clock transition time) or decreased (i.e., slower slew rate, longer clock transition time).

In addition to the DTS clock driver 120 providing the INCLK signal to the global clock tree circuit 20, the INCLK signal is provided to an adjustable global clock tree model 140. The global clock tree model 140 introduces a delay that models a propagation delay of the global clock tree circuit 20, and is additionally adjustable based on a control signal CDNCTRL to increase or decrease the delay introduced. The delayed INCLK signal is output to a local clock tree model 150, which introduces a delay that models a propagation delay of the local clock tree circuit and STD clock driver 30. Responsive to receiving the delayed INCLK signal, the local clock tree model 150 generates a feedback clock signal FbR. The INCLKF signal generated by the DTS clock driver 125 is provided through a similar set of model delays as the INCLK signal. In particular, the INCLKF signal is provided to a global clock tree model 145 that provides a delay similar to the global clock tree model 140, and is similarly adjusted by the CDNCTRL signal to increase or decrease the delay introduced. The delayed INCLKF signal is then provided to a local clock tree model 155 that introduces an additional delay that models a propagation delay of the local clock tree circuit and STD clock driver 30 to generate a feedback signal FbF. As a result of the INCLK and INCLKF signals provided through similar model delay paths, the FbR and FbF signals have the same delay relative to the INCLK and INCLKF signals, respectively.

A selection circuit 160 receives the CkR, CkF, FbR, FbF signals from the local clock tree circuit and STD clock driver 30 and the local clock tree models 150, 155. The selection circuit is controlled by DCC control logic 170 based on a control signal CTRL to selectively provide two input clock signals to a phase detector 180 for phase comparison. An example of the selection circuit 160 is a multiplexer circuit of conventional design and operation that provides two of the four input clock signals to the phase detector. As will be explained in detail below, the phase detector 180 compares the phases of the input clock signals and generates the CDNCTRL signal based at least in part thereon to adjust the delay of the global clock tree models 140, 145 to reduce and ideally eliminate a phase difference between the input clock signals. The DCC control logic 170 further controls the phase detector 180 to generate the DRVCTRL signal to adjust the DTS clock drivers 120, 125 based at least in part on a phase comparison to compensate for duty-cycle distortion.

Figure 2:
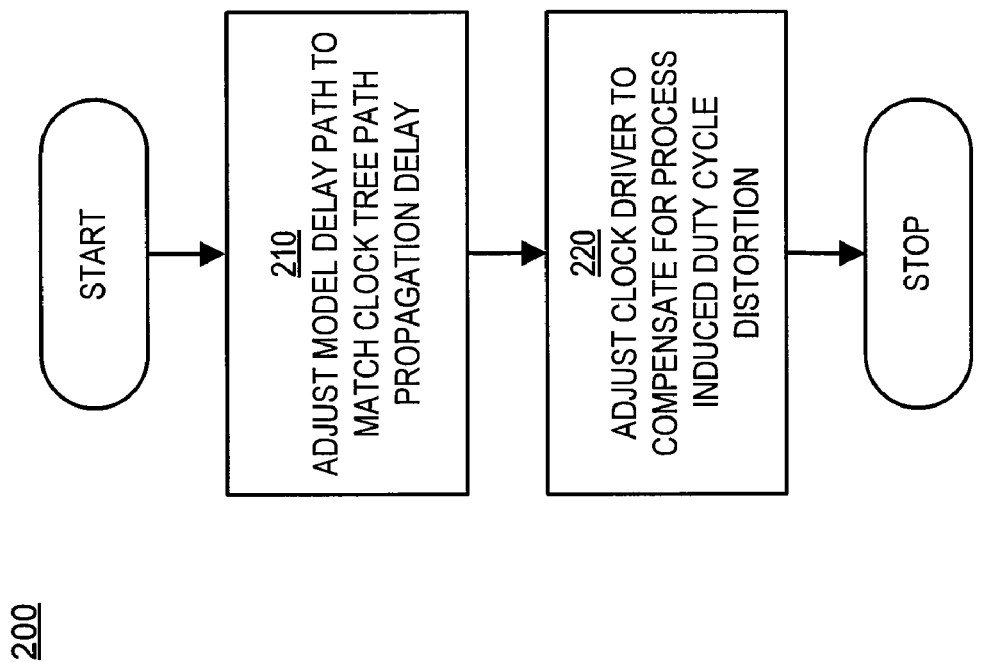
FIG. 2 is a flow diagram of an example for correcting duty-cycle distortion.

Operation of the DCC circuit 100 according to an embodiment of the invention will be described with reference to FIG. 2. In a first phase, the delay of the model delay paths are matched to the propagation delay of the clock tree path of the CDN 10 at 210, such as by adjusting the global clock tree model 140 so that the CkR and FbR signals are synchronized. The global clock tree model 145 is adjusted to have the same delay as the global clock tree model 140. As a result, the model delay paths for the FbR and the FbF signals have the same delay. Upon detecting completion of adjusting the global clock tree models 140, 145, for example, monitoring for a stable CDNCTRL signal indicating delay adjustments are no longer made, the DCC control logic 170 controls the DCC circuit 100 to switch into a second phase. In the second phase, the DTS clock driver 125 is adjusted, for example, drive strength, until duty-cycle distortion, as represented by a phase difference between the CkF and FbF signals, is compensated at 220. The DTS clock driver 120 is adjusted in the same manner, for example, by adjusting the DTS clock driver 120 to have same drive strength as the DTS clock driver 125. In some embodiments, the DTS clock driver 125 is first adjusted to provide a stable reference signal (e.g., CkF) before similarly adjusting the DTS clock driver 120 in the same manner. As a result of adjusting the DTS clock driver 120 to have the same characteristics as the DTS clock driver 125 that resulted in matching phases of the CkF and FbF signals, the CkR signal (and the CkF signal) are duty-cycle corrected. That is, the phase relationship of corresponding clock transitions of the CkR and CkF signals (e.g., rising edges of the CkR and CkF) are 180 degrees out of phase to represent duty-cycle corrected clock signals. In effect, where the corresponding clock transitions are used to clock respective circuits, for example, data output drivers, the respective circuits will operate as if clocked by a clock signal having a 50 percent duty cycle. The INCLK signal generated by the DTS clock driver 120 that is input to the clock tree network of the global clock tree 20, and local clock tree and STD clock driver 30, and used to generate the CkR, CkF signals, compensates for process induced duty-cycle distortion, for example, introduced by propagating a clock signal through the CDN 10. In some embodiments, the circuits of the DCC circuit 100 are disabled after completion of phases one and two in order to reduce power consumption. In some embodiments, the DCC circuit 100 remains activated, or is activated periodically to correct duty-cycle distortion.

Figure 3B:
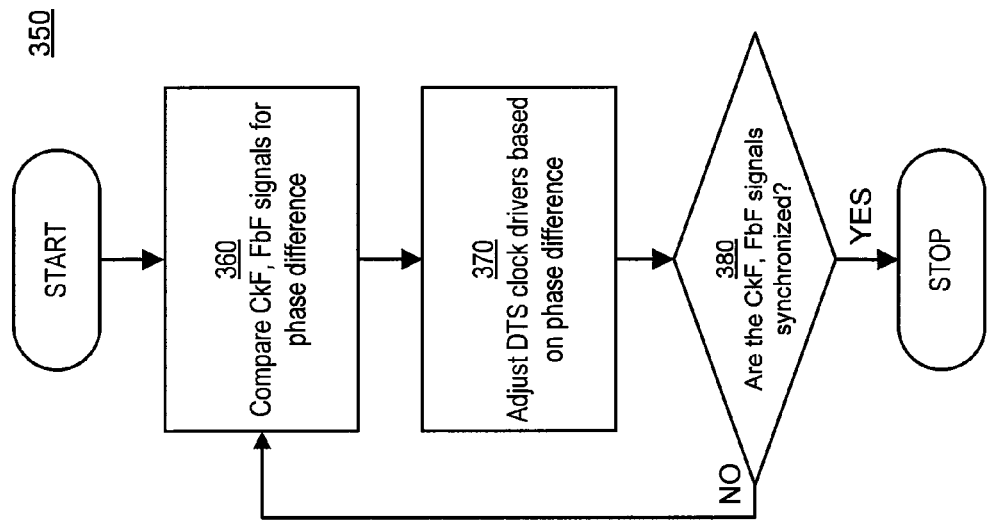
FIGS. 3A and 3B are flow diagrams of examples for correcting duty-cycle distortion.
Figure 3A:
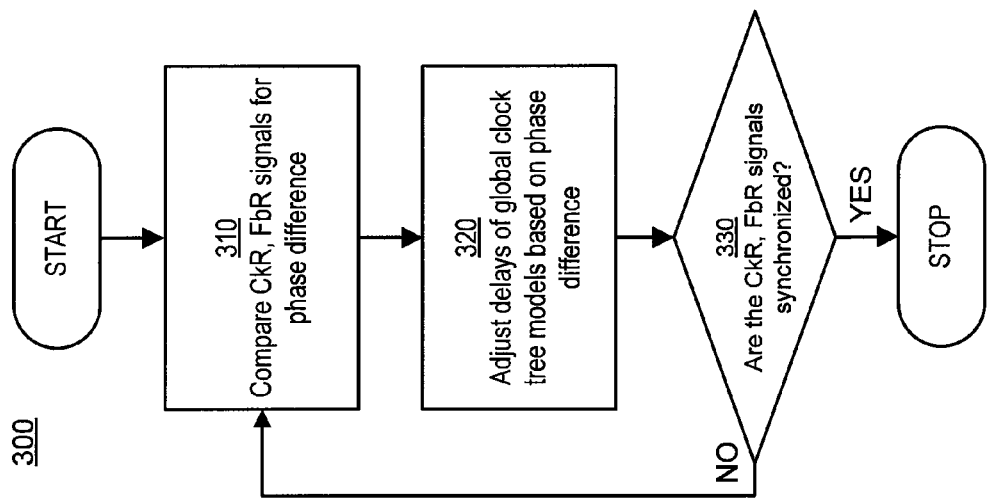

FIG. 3A illustrates a process 300 for matching the delay of the model delay path to the propagation delay of the clock tree path of the CDN 10 according to an embodiment of the invention. The DCC control logic 170 controls the selection circuit 160 to provide the CkR and FbR signals to the phase detector 180 for phase comparison at 310. The phase detector 180 generates the CDNCNTRL signal to adjust the adjustable delay of the global clock tree model 140 at 320 based at least in part on the comparison. Steps 310, 320 are repeated until the CkR and FbR signals are synchronized at 330. For example, where the CkR signal leads the FbR signal, the delay of the global clock tree model 140 is decreased to advance the phase of the FbR signal relative to the CkR signal until the signals are in phase. Conversely, where the CkR signal lags the FbR signal, the delay of the global clock tree model 140 is increased to retard the phase of the FbR signal relative to the CkR signal until the signals are in phase. When the global clock tree model 140 is adjusted to provide the delay to synchronize the CkR, FbR signals, the delay of the global clock tree model 145 is adjusted to provide the same delay. As a result, the delay of the model delay path for the FbR signal and the delay of the model delay path for the FbF signals are matched. In some embodiments, the adjustable delay of the global clock tree model 140 is a digital delay that is adjusted using digital values provided by the phase detector 180 as the CDNCTRL signal. The global clock tree model 145 may have the same design as the global clock tree model 140 and the delays matched by providing the same CDNCTRL signal (i.e., digital value) to the global clock tree model 145. In other embodiments, different types of adjustable delays and delay control may be used.

FIG. 3B illustrates a process 350 for adjusting the DTS clock driver 120 to compensate for process induced duty-cycle distortion according to an embodiment of the invention. The DCC control logic 170 controls the selection circuit 160 to provide the CkF and FbF signals to the phase detector 180 for phase comparison at 360. The phase detector 180 generates the DRVCTRL signal to adjust the DTS clock driver 125 based at least in part on the phase comparison, and similarly adjusts DTS clock driver 120 (e.g., using the same DRVCTRL signal) at 370. Steps 360, 370 are repeated until the phase detector 180 detects synchronization of the CkF and FbF signals at 380. In some embodiments, the DTS clock driver 125 is initially adjusted until the phase detector 180 detects synchronization of the CkF and FbF signals before then similarly adjusting the DTS clock driver 120. For example, in an embodiment having DTS clock drivers 120, 125 with adjustable output drive strength, the slew rate of the INCLKF signal is adjusted until the phase detector 180 detects synchronization of the FbF signal with the CkF signal. Adjusting the slew rate of the INCLKF and INCLK signals can compensate for duty-cycle distortion. For example, where the distortion decreases the duty cycle (e.g., the time the clock signal is HIGH is less than 50 percent), the drive strengths of the DTS clock drivers 120, 125 can be decreased to compensate by providing a lower slew rate. Conversely, where the distortion increases the duty cycle (e.g., the time the clock signal is HIGH is greater than 50 percent), the drive strengths of the DTS clock drivers 120, 125 can be increased to compensate by providing a higher slew rate. In other embodiments, the DTS clock drivers 120, 125 have adjustable characteristics other than adjustable drive strengths, for example, an adjustable propagation delay.

Figure 4:
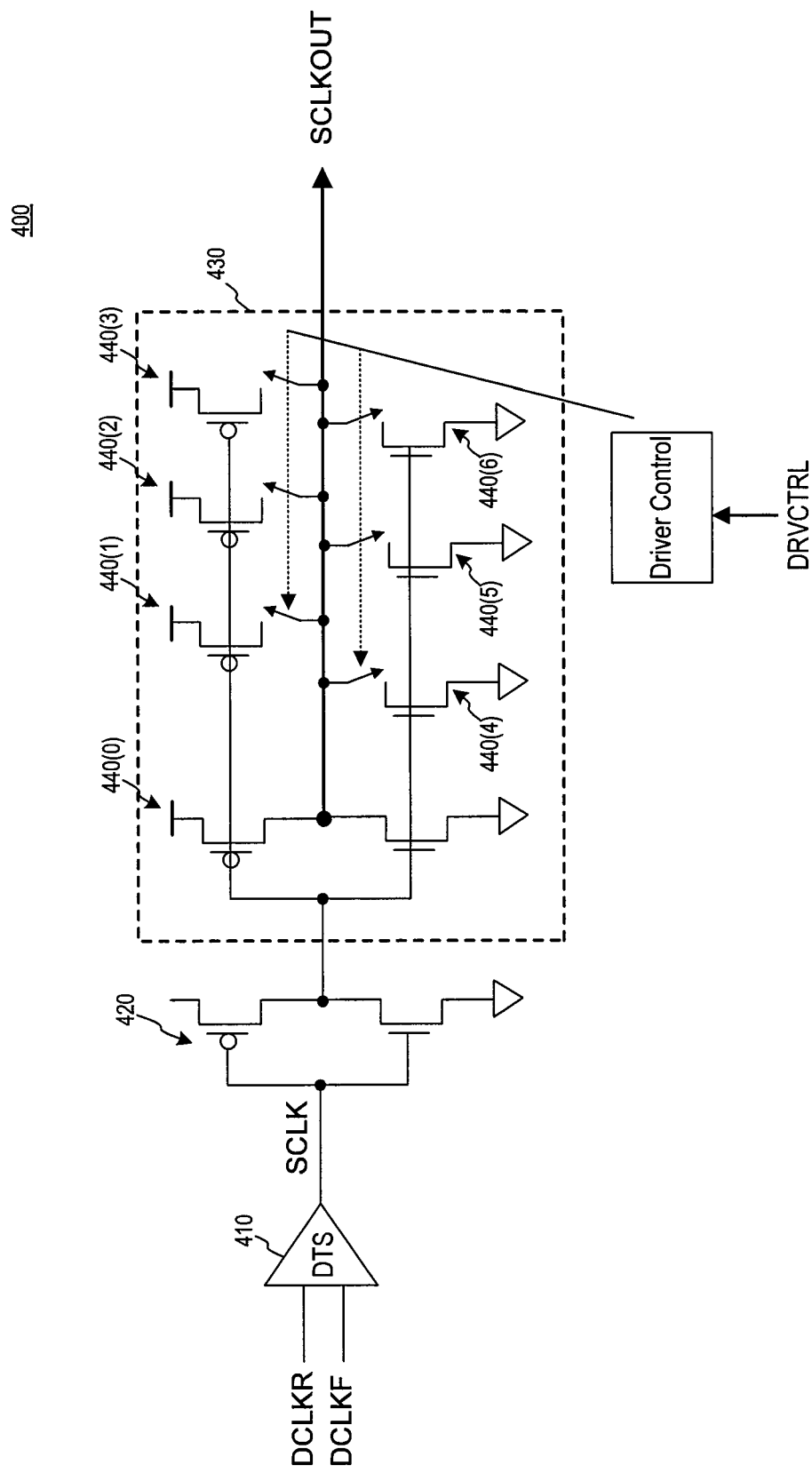
FIG. 4 is a block diagram of an example differential-to-single-ended clock driver.

FIG. 4 illustrates a DTS clock driver 400 having adjustable drive strength according to an embodiment of the invention. The DTS clock driver 400 includes a DTS clock driver stage 410 that receives differential input clock signals DCLKR, DCLKF, and in response, generates a single-ended clock signal SCLK. The SCLK signal is provided to an inverter 420 that inverts the SCLK signal to be provided to an adjustable inverter circuit 430. The adjustable inverter circuit 430 inverts the signal from the inverter 420 and drives a single-ended output signal SCLKOUT. The adjustable inverter circuit 430 includes an inverter stage 440(0) and a plurality of pull-up and pull-down transistors 440(1)-(6). Although six pull-up and pull-down transistors 440(1)-(6) are illustrated in FIG. 4, greater or fewer pull-up and pull-down transistors can be used as well. Each of the pull-up and pull-down transistors 440(1)-(6) can be selectively coupled to the output of the DTS clock driver 400 to increase drive strength of the adjustable inverter circuit 430, and as a result, increase the drive strength of DTS clock driver 400. The pull-up and pull-down transistors 440(1)-(6) may be coupled to the output independently. Coupling of the pull-up and pull-down transistors 440(1)-(6) is controlled by a control signal, for example, DRVCTRL. The pull-up and pull-down transistors 440(1)-(6) may be identical, or have different drive characteristics. In some embodiments, the DTS clock driver 410 is additionally adjustable to adjust a duty cycle of the SCLK signal provided to the inverter 420 to add flexibility in adjusting the duty cycle of the SCLKOUT signal.

Figure 5A:
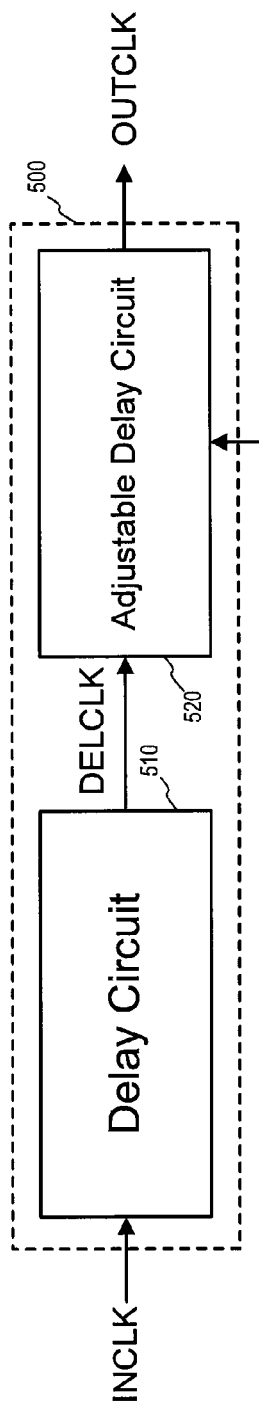
FIG. 5A is a block diagram of an example adjustable global clock tree model.
Figure 5B:
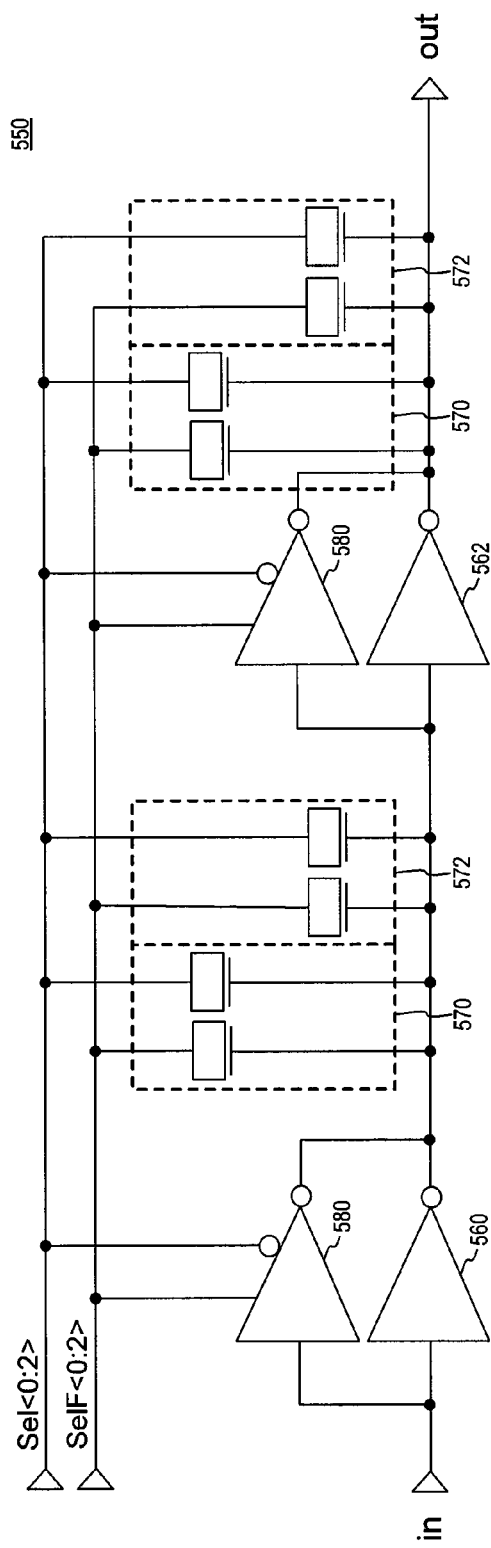
FIG. 5B is a block diagram of an example adjustable delay circuit that may be used in the example adjustable global clock tree model of FIG. 5A.

FIG. 5A illustrates a global clock tree model 500 according to an embodiment of the invention. The global clock tree model 500 includes a delay circuit 510 and an adjustable delay circuit 520 coupled in series. An input clock signal INCLK applied to the global clock tree model 500 will be delayed by the total delay of the delay circuit 510 and the adjustable delay circuit 520 to provide an output clock signal OUTCLK. The adjustable delay circuit 520 has an adjustable delay that is set based on a control signal (or signals) SEL, SELF. FIG. 5B illustrates an adjustable delay circuit 550. The adjustable delay circuit 500 includes series coupled inverters 560, 562 to generate the OUTCLK signal responsive to the INCLK signal. Impedance circuits 570, 572 coupled to the outputs of the inverters 560, 562 can be used to selectively increase the loading at the outputs thereby providing a delay to the DELCLK signal. Which of the impedance circuits 570, 572 will be used to increase the loading of the outputs of the inverters 560, 562 is controlled by the SEL, SELF signals, for example, the control signal CDNCTRL from the DCC control logic 170 (FIG. 1). The impedance circuits 570, 572 are shown in FIG. 5B as capacitance coupled to the outputs of the inverters 560, 562. The capacitances may have different capacitance characteristics, or alternatively, have the same capacitance characteristics. Types of impedance circuits other than capacitors may be used as well. The adjustable delay circuit 550 further includes secondary inverters 580 that are activated by the SEL, SELF signals. The drive characteristics of the secondary inverters 580 may be different than those of the inverters 560, 562 in order to reduce the overall drive capability of the adjustable delay circuit 500, thereby adding delay to the DELCLK signal in generating the OUTCLK signal. The SEL, SELF signals are shown in FIG. 5B as a three-bit value, with each bit controlling a respective impedance circuit 570, 572 or secondary inverter 580. It will be appreciated, however, that fewer or greater impedance circuits and/or inverters and secondary inverters may be used with corresponding control signals without departing from the scope of the invention.

Figure 6:
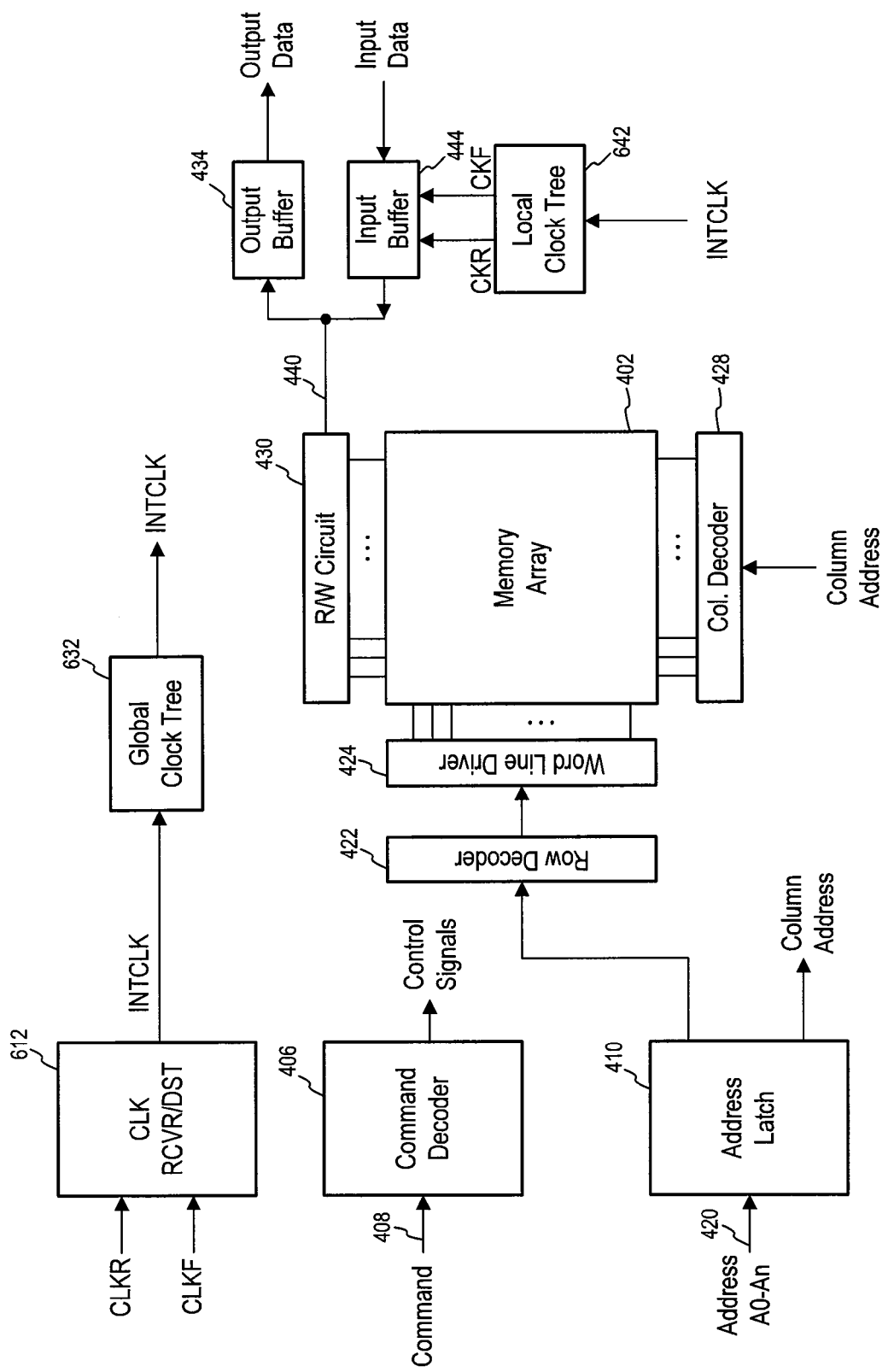
FIG. 6 is a block diagram of a memory having a duty-cycle correction circuit according to an embodiment of the invention.

FIG. 6 illustrates a portion of a memory 600 according to an embodiment of the present invention. The memory 600 includes an array 602 of memory cells, which may be, for example, DRAM memory cells, SRAM memory cells, flash memory cells, or some other types of memory cells. The memory 600 includes a command decoder 606 that receives memory commands through a command bus 608 and generates corresponding control signals within the memory 600 to carry out various memory operations. A clock receiver and differential-to-single-ended clock driver 612 receives a differential input clock signals CLKR, CLKF and generates a single-ended input clock signal INCLK. The INCLK signal is provided to a global clock tree 632 for distribution of the INCLK to various circuits of the memory 600 as the internal clock signal INTCLK.

Row and column address signals are applied to the memory 600 through an address bus 620 and provided to an address latch 610. The address latch then outputs a separate column address and a separate row address. The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses.

The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630. The data input buffer 644 is clocked by differential clock signals CkR, CkF provided by the local clock tree and single-ended-to-differential (STD) clock driver 642. The CkR, CkF signals are generated based at least in part on the INTCLK signal provided to the local clock tree and STD clock driver 642 from the global clock tree 632. The CkR, CkF signals are provided to a DCC circuit 638 that generates a driver control signal DRVCTRL. The DRVCTRL signal is used to adjust a clock driver in the clock receiver and differential-to-single-ended clock driver 612 to compensate for process induced duty-cycle distortion, thereby correcting the duty-cycle of the CkR, CkF signals. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A duty-cycle correction (DCC) circuit generating a clock signal for distribution over a clock distribution network, the clock distribution network providing differential output clock signals, the DCC circuit comprising:
   a first adjustable differential-to-single ended (DTS) clock driver configured to generate the clock signal for distribution from input differential clock signals, the first adjustable DTS clock driver having an adjustable electrical characteristic;
   a second adjustable DTS clock driver configured to generate a complementary single-ended clock signal from the input differential clock signals, the complementary single-ended clock signal complementary to the clock signal for distribution, the second adjustable DTS clock driver having a same adjustable electrical characteristic as the first adjustable DTS;
   a first adjustable delay having a first delay and configured to provide a first feedback clock signal having the first delay relative to the clock signal for distribution;
   a second adjustable delay having a second delay and configured to provide a second feedback clock signal having the second delay relative to the complementary single-ended clock signal; and
   a phase detector configured to determine a phase difference between a first one of the differential output clock signals and the first feedback clock signal and adjust the first and second delays based thereon and further configured to determine a phase difference between a second one of the output differential clock signals and the second feedback clock signal and adjust the electrical characteristics of the first and second adjustable DTS clock drivers based thereon.

2. The DCC circuit of claim 1 wherein the first and second adjustable DTS clock drivers, the first and second adjustable delays, and the phase detector are further configured to be disabled following adjustment of the electrical characteristic of the first and second adjustable DTS clock drivers based on the phase difference between a second one of the output differential clock signals and the second feedback clock signal.

3. The DCC circuit of claim 1 wherein the first and second adjustable DTS clock drivers comprise a DTS clock driver having an adjustable output drive strength and configured to generate a single-ended output clock signal responsive to differential clock signals and based at least in part on the adjustable output drive strength.

4. The DCC circuit of claim 1 wherein the first and second adjustable DTS clock drivers comprise a DTS clock driver having an adjustable propagation delay and configured to generate a single-ended output clock signal responsive to differential clock signals and based at least in part on the adjustable propagation delay.

5. The DCC circuit of claim 3 wherein the DTS clock driver having an adjustable output drive strength comprises:
   a differential-to-single-ended clock driver stage configured to generate a single-ended clock signal responsive to differential clock signals;
   an inverter coupled to the differential-to-single-ended clock driver stage to receive the single-ended clock signal and configured to generate a first inverted single-ended clock signal; and
   an adjustable inverter having an adjustable output drive strength, the adjustable inverter coupled to the inverter and configured to generate an inverted first inverted single-ended clock signal based at least in part on the adjustable output drive strength.

6. The DCC circuit of claim 1, further comprising:
   a selection circuit coupled to receive as input signals the output differential clock signals, and the first and second feedback clock signals and further coupled to the phase detector, the selection circuit configured to provide two of the input signals to the phase detector based at least in part on a selection circuit control signal; and
   control logic coupled to the selection circuit and configured to generate the control signal to provide a first one of the differential output clock signals and the first feedback clock signal to the phase detector for phase comparison and provide a second one of the differential output clock signals and the second feedback clock signal to the phase detector for phase comparison.

7. The DCC circuit of claim 1, wherein the selection circuit comprises a multiplexer.

8. The DCC circuit of claim 1 wherein the first adjustable delay comprises an adjustable delay configured to be adjusted to model a propagation delay of the clock distribution network.

9. The DCC circuit of claim 1 wherein the first and second adjustable delays comprise digitally adjustable delays.

10. A clock distribution network for providing output differential clock signals, comprising:
   a first adjustable differential-to-single ended (DTS) clock driver configured to generate a first single-ended clock signal from input differential clock signals, the first adjustable DTS clock driver having an adjustable drive strength;
   a clock path coupled to the first adjustable DTS clock driver configured to receive the single-ended clock signal and provide the output differential clock signals responsive to the single-ended clock signal;
   a second adjustable DTS clock driver configured to generate a second single-ended clock signal complementary to the first single-ended clock signal from the input differential clock signals, the second adjustable DTS clock driver having an adjustable drive strength;

a first model delay coupled to the first adjustable DTS clock driver and configured to model a propagation delay of the clock path and provide a first feedback clock signal having the model delay relative to the first single-ended clock signal;

a second model delay coupled to the second adjustable DTS clock driver and configured to model the propagation delay of the clock path and provide a second feedback clock signal having the model delay relative to the second single-ended clock signal; and a phase detector coupled to the clock path, and the first and second model delays, the phase detector configured to compare one of the output differential clock signals and the second feedback clock signal and generate the driver control signal based on a phase difference therebetween to adjust the drive strengths of the first and second adjustable DTS clock drivers based on the phase difference.

11. The clock distribution network of claim 10 wherein the clock path comprises:

a global clock tree circuit coupled to receive the first single-ended clock signal and generate an internal clock signal responsive thereto; and a local clock tree circuit coupled to receive the internal clock signal, the local clock tree circuit having a single-ended-to-differential (STD) clock driver configured to generate output differential clock signals responsive to the internal clock signal.

12. The clock distribution network of claim 10 wherein the first and second model delays comprise first and second adjustable delays.

13. The clock distribution network of claim 12 wherein the first and second adjustable delays comprise:

a delay having a fixed delay, the delay coupled to receive a single-ended input clock signal and generate a delayed clock signal having the fixed delay relative to the single-ended input clock signal; and an adjustable delay having a delay adjustable based at least in part on a control signal, the adjustable delay configured to receive the delayed clock signal and generate an single-ended output signal having the adjusted delay relative to the delayed clock signal.

14. The clock distribution network of claim 13 wherein the adjustable delay comprises:

first and second series coupled inverters; and first and second impedance circuits, each coupled to an output of a respective inverter and configured to add impedance to the output of the respective inverter based at least in part on the control signal.

15. The clock distribution network of claim 14 wherein the first and second impedance circuits each comprise a respective capacitance coupled to the output of the respective inverter.

16. The clock distribution network of claim 14 wherein the adjustable delay further comprises:

first and second secondary inverters, each coupled in parallel with a respective one of the first and second series coupled inverters and configured to be activated responsive to the control signal, each of the secondary inverters having drive characteristics different than the first and second inverters.

17. A method for correcting duty-cycle distortion of differential output clock signals provided from a clock distribution network, comprising:

generating a single-ended clock signal from differential input clock signals for distribution over the clock distribution network and from which the differential output clock signals are generated;

matching a delay of a model delay path to a propagation delay of the clock distribution network; and adjusting the single ended clock signal to compensate for duty-cycle distortion by adjusting transition rates of a clock edge for the single ended clock signal.

18. A method for correcting duty-cycle distortion of differential output clock signals provided from a clock distribution network, comprising:

generating a single-ended clock signal from differential input clock signals for distribution over the clock distribution network and from which the differential output clock signals are generated;

matching a delay of a model delay path to a propagation delay of the clock distribution networks; and adjusting the single ended clock signal to compensate for duty-cycle distortion by adjusting propagation delay of the single ended clock signal during generation of the same from differential input clock signals.

19. A method for generating duty-cycle corrected differential output clock signals, the method comprising:

generating first and second single-ended clock signals from differential input clock signals;

providing the first single-ended clock signal over a clock distribution network;

generating differential output clock signals responsive to the first single-ended clock signal;

generating a first feedback clock signal from the first single-ended clock signal;

generating a second feedback clock signal from the second single-ended clock signal, the second feedback clock signal complementary to the first feedback clock signal;

adjusting a phase of the first feedback clock signal to synchronize the first feedback clock signal to a first one of the differential output clock signals;

adjusting a phase of the second feedback clock signal the same as the first feedback signal is adjusted;

adjusting a slew rate of the second single-ended clock signal to synchronize the second feedback clock signal with a second one of the differential output clock signals.

20. The method of claim 19 wherein generating the first and second single-ended clock signals, generating the first and second feedback clock signals, adjusting the phase of the first and second feedback clock signals, and adjusting the slew rate of the second single-ended clock signal are ceased after completion of adjusting the slew rate of the second single-ended clock signal.

21. The method of claim 19 wherein generating the first and second single-ended clock signals, generating the first and second feedback clock signals, adjusting the phase of the first and second feedback clock signals, and adjusting the slew rate of the second single-ended clock signal are repeated periodically.

22. The method of claim 19 wherein adjusting a phase of the first feedback clock signal comprises:

comparing the first feedback clock signal and the first one of the differential output clock signals to determine a phase difference therebetween; and adjusting a model delay of a model delay circuit based on the phase difference, the first feedback signal having the model delay relative to the intermediate single-ended clock signal.

23. The method of claim 22 wherein adjusting a slew rate of the second single-ended clock signal comprises adjusting the slew rate of the second single-ended clock signal upon detecting completion of adjusting the phase of the first feedback clock signal.

24. The method of claim 23 wherein detecting completion of adjusting the phase of the first feedback clock signal comprises monitoring for a stable control signal used to adjust the model delay of the model delay circuit.

25. The method of claim 19 wherein adjusting the slew rate comprises:
   adjusting a drive strength of a second differential-to-single-ended clock driver generating the second single-ended clock signal from which the differential output clock signals are generated; and
   adjusting a drive strength of a first differential-to-single-ended clock driver generating the first single-ended clock signal.

26. The method of claim 25 wherein adjusting drive strengths of the first and second differential-to-single-ended clock drivers comprises:
   determining a phase difference between the second feedback clock signal and the second one of the differential output clock signals; and
   adjusting the drive strengths of the first and second differential-to-single-ended clock drivers based on the phase difference.

27. The method of claim 19 wherein generating the first feedback clock signal comprises delaying the first single-ended clock signal by a delay substantially equal to a propagation delay of the clock distribution network.

28. The method of claim 19 wherein generating the second feedback clock signal comprises:
   delaying the second single-ended clock signal by a delay substantially equal to a propagation delay of the clock distribution network.

* * * * *